(12) United States Patent
Kim et al.

(10) Patent No.: US 10,014,259 B2
(45) Date of Patent: Jul. 3, 2018

(54) LIGHT EMITTING DEVICE, LIGHT EMITTING DEVICE PACKAGE COMPRISING LIGHT EMITTING DEVICE, AND LIGHT EMITTING APPARATUS COMPRISING LIGHT EMITTING DEVICE PACKAGE

(71) Applicant: LG INNOTEK CO., LTD., Seoul (KR)

(72) Inventors: Sung Kyoon Kim, Seoul (KR); Chung Song Kim, Seoul (KR); Ji Hyung Moon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/519,089

(22) PCT Filed: Aug. 11, 2015

(86) PCT No.: PCT/KR2015/008409
§ 371 (c)(1),
(2) Date: Apr. 13, 2017

(87) PCT Pub. No.: WO2016/060369
PCT Pub. Date: Apr. 21, 2016

(65) Prior Publication Data
US 2017/0229398 A1 Aug. 10, 2017

(30) Foreign Application Priority Data
Oct. 17, 2014 (KR) ........................ 10-2014-0140873

(51) Int. Cl.
*H01L 23/535* (2006.01)
*H01L 27/15* (2006.01)
(Continued)

(52) U.S. Cl.
CPC ........ *H01L 23/535* (2013.01); *H01L 27/0814* (2013.01); *H01L 27/156* (2013.01);
(Continued)

(58) Field of Classification Search
CPC . H01L 23/535; H01L 27/0814; H01L 27/156; H01L 33/02; H01L 33/25; H01L 33/48
See application file for complete search history.

(56) References Cited

U.S. PATENT DOCUMENTS 6,547,249 B2 4/2003 Collins, III et al.
7,417,259 B2 8/2008 Sakai et al.
(Continued)

FOREIGN PATENT DOCUMENTS

JP     2010-219310 A     9/2010
KR     10-1104780 B1     1/2012
(Continued)

*Primary Examiner* — Fazli Erdem
(74) *Attorney, Agent, or Firm* — Birch, Stewart, Kolasch & Birch, LLP

(57) ABSTRACT

A light emitting device according to an embodiment includes a substrate; first to Mth light emitting cells (where M is a positive integer of two or more) which are arranged on the substrate so as to be spaced apart from each other; and first to (M−1)th interconnection wires which electrically connect the first to Mth light emitting cells in series, wherein an mth light emitting cell (where 1≤m≤M) includes a first conductive type semiconductor layer, an active layer and a second conductive type semiconductor layer, which are sequentially arranged on the substrate, and wherein an nth interconnection wire (where 1≤n≤M−1) interconnects the first conductive type semiconductor of the nth light emitting cell with the second conductive type semiconductor of the (n+1)th light emitting cell, and has a plurality of first branch wires which are spaced apart from each other.

20 Claims, 4 Drawing Sheets

(51) Int. Cl.
  *H01L 33/02* (2010.01)
  *H01L 33/26* (2010.01)
  *H01L 33/48* (2010.01)
  *H01L 27/08* (2006.01)

(52) U.S. Cl.
  CPC .............. *H01L 33/02* (2013.01); *H01L 33/26* (2013.01); *H01L 33/48* (2013.01); *H01L 2223/58* (2013.01)

(56) References Cited

U.S. PATENT DOCUMENTS

| | | | |
|---|---|---|---|
| 2008/0017871 A1* | 1/2008 | Lee | H01L 25/0753 257/88 |
| 2010/0220479 A1* | 9/2010 | Yamashita | F21K 9/00 362/249.02 |
| 2011/0284884 A1* | 11/2011 | Lee | H01L 27/153 257/88 |
| 2012/0187424 A1* | 7/2012 | Kim | H01L 27/156 257/88 |
| 2014/0131729 A1 | 5/2014 | Heo et al. | |
| 2014/0183572 A1* | 7/2014 | Kim | H01L 25/0753 257/88 |
| 2014/0183573 A1* | 7/2014 | Kim | H01L 27/156 257/88 |
| 2017/0186810 A1* | 6/2017 | Lee | H01L 27/15 |

FOREIGN PATENT DOCUMENTS

| KR | 10-2013-0087894 A | 8/2013 |
|---|---|---|
| KR | 10-2014-0047871 A | 4/2014 |

* cited by examiner

【FIG. 1】
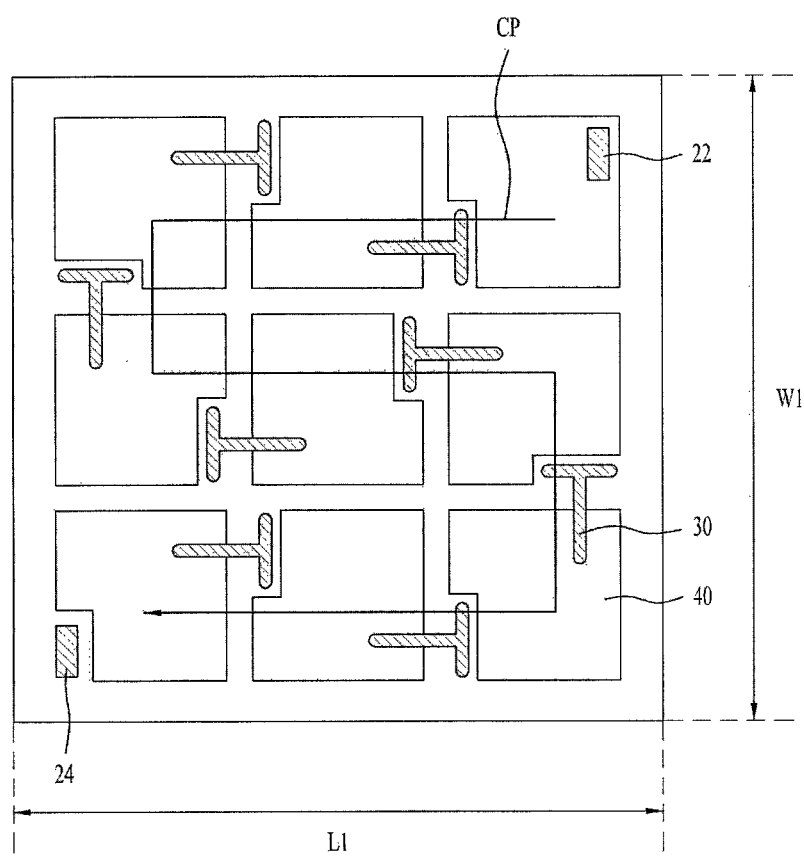

[FIG. 2]
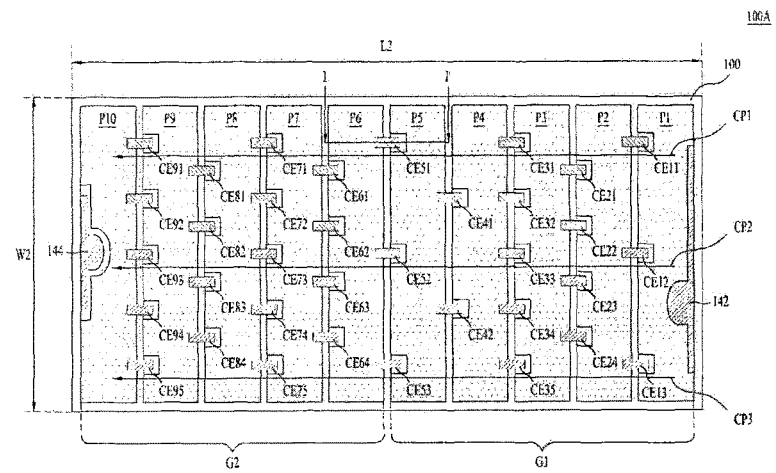
[FIG. 3]
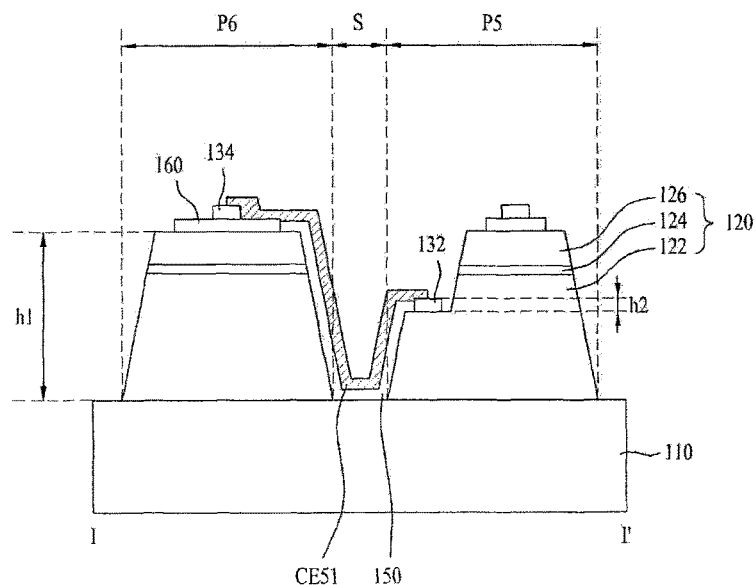
[FIG. 4]
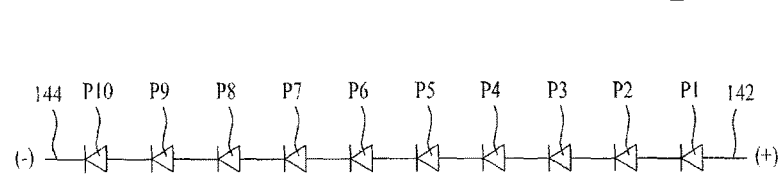

[FIG. 5]
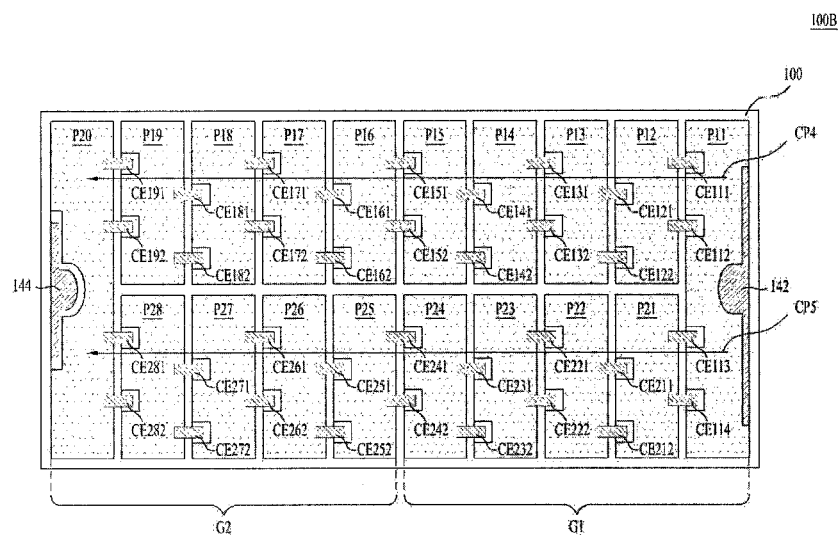
[FIG. 6]
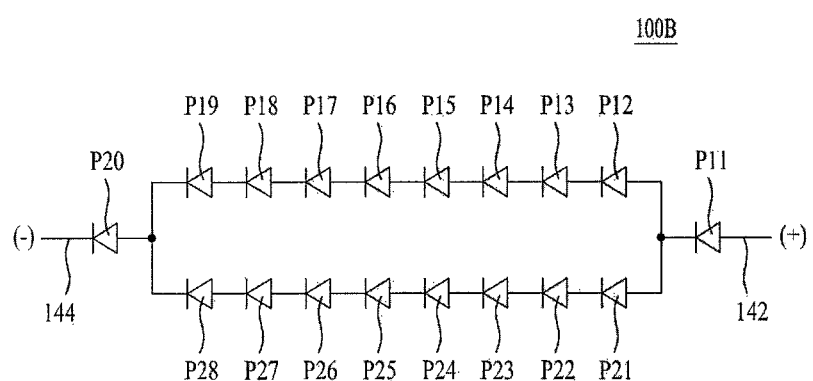

[FIG. 7]
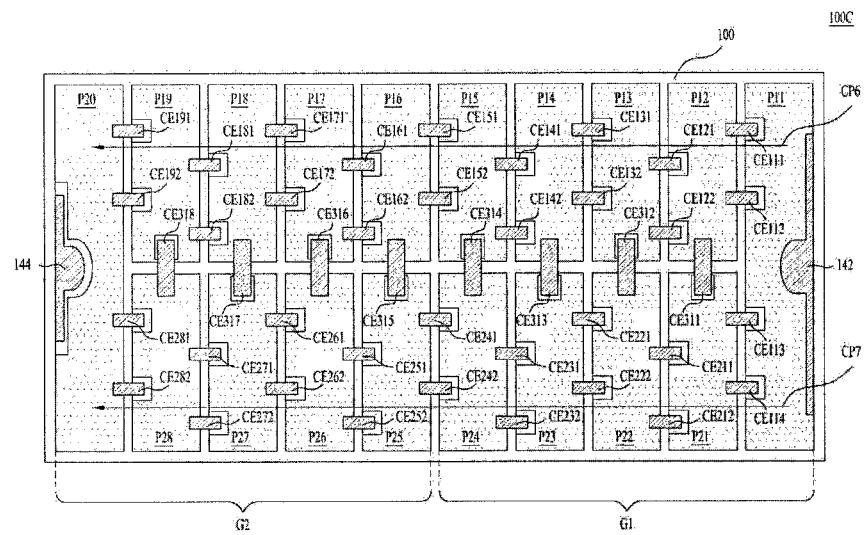
[FIG. 8]
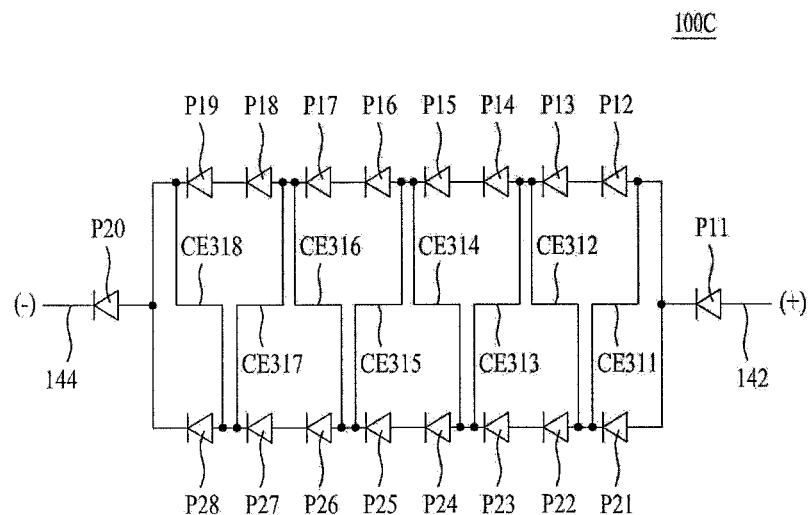

LIGHT EMITTING DEVICE, LIGHT EMITTING DEVICE PACKAGE COMPRISING LIGHT EMITTING DEVICE, AND LIGHT EMITTING APPARATUS COMPRISING LIGHT EMITTING DEVICE PACKAGE

CROSS REFERENCE TO RELATED APPLICATIONS

This application is the National Phase of PCT/KR2015/008409 filed on Aug. 11, 2015, which claims priority under 35 U.S.C. § 119(a) to Patent Application No. 10-2014-0140873 filed in the Republic of Korea on Oct. 17, 2014, all of which are hereby expressly incorporated by reference into the present application.

TECHNICAL FIELD

Embodiments relate to a light emitting device, a light emitting device package including the device, and a light emitting apparatus including the package

BACKGROUND ART

Based on the development of metal organic chemical vapor deposition method, molecular beam epitaxy method, and the like of gallium nitride (GaN), red, green and blue light emitting diodes (LEDs) that may have high luminance and realize white light have been developed.

Such LEDs do not contain environmentally harmful materials such as mercury (Hg), which is used in existing luminaires, such as incandescent lamps and fluorescent lamps and thus exhibit excellent eco-friendliness, long lifespan, and low power-consumption and thus are replacing conventional light sources. A core competitive factor in such LEDs is to achieve high luminance using chips with high efficiency and high power output and packaging techniques.

To realize high luminance, it is important to increase light extraction efficiency. To increase light extraction efficiency, research into various methods using flip-chip structures, surface texturing, patterned sapphire substrates (PSSs), a photonic crystal technology, anti-reflection layer structures, and the like is underway.

FIG. 1 is a plan view of a conventional light emitting device 10.

The light emitting device 10 illustrated in FIG. 1 consists of first and second electrode pads 22 and 24, nine light emitting cells 40, and connection wires 30 electrically connecting the adjacent light emitting cells 40. In this regard, the neighboring light emitting cells 40 are connected to each other by the connection wire 30. When the connection wire 30 is broken, there is a problem that the light emitting element 10 is not operated.

DISCLOSURE

Technical Problem

The embodiments provide a light emitting device, a light emitting device package including the device, and a light emitting apparatus including the package which may minimize or prevent the non-operation thereof due to the brokenness of the connection wire.

Technical Solution

In one embodiment, a light emitting device may include a substrate; first to Mth (where, M is a positive integer of two or more) light emitting cells disposed to be spaced apart from each other on the substrate; and first and (M−1)th connection wires configured to electrically connect the first to the Mth light emitting cells in series, wherein mth (where, $1 \leq m \leq M$) light emitting cell comprises a first conductive type semiconductor layer, an active layer, and a second conductive type semiconductor layer sequentially disposed on the substrate, and wherein nth (where, $1 \leq n \leq N$, where, N is M−1) connection wire connects the first conductive type semiconductor layer of nth light emitting cell to the second conductive type semiconductor layer of the (n+1)th light emitting cells, the nth connection wire including a plurality of first branch wires spaced apart from each other.

The numbers of the first branch wires included in the first to the Nth connection wires may be equal to each other or different from each other.

The first conductive type semiconductor layer may include an n-type semiconductor layer, and the second conductive semiconductor layer may include a p-type semiconductor layer. In this case, the number of the first branch wires may increase as the first branch wires approaches from the first connection wire to the nth connection wire.

The first to the Mth light emitting cells may be divided into a plurality of groups, and a total number of the first branch wires included in a connection wire belonging to a group adjacent to the Mth light emitting cell may be greater than a total number of the first branch wires included in a connection wire belonging to a group adjacent to the first light emitting cell.

The numbers of the light emitting cells included in a plurality of groups may be different from each other or equal to each other.

The first to the Mth light emitting cells may be disposed in a straight line.

The first to the Mth light emitting cells may be connected to each other in a first direction, the second direction may be perpendicular to the first direction, and a length of the light emitting device in the first direction may be greater than a width of the light emitting device in the second direction.

The light emitting device may further include (M+1)th to (2M−2)th light emitting cells disposed between the first light emitting cell and the Mth light emitting cell to be spaced apart from each other on the substrate; and Mth to (2M−2)th connection wires connecting the first, the M+1st to (2M−2)th, and the Mth light emitting cells in series, wherein kth (where, $M+1 \leq k \leq 2M-2$) light emitting cell may include a first conductive type semiconductor layer, an active layer, and a second conductive type semiconductor layer sequentially disposed on the substrate, wherein Mth connection wire may connect the first conductive type semiconductor layer of the first light emitting cell and the second conductive type semiconductor layer of (M+1)th light emitting cell, wherein jth (where, $M+1 \leq j \leq 2M-3$) connection wire may connect the first conductive type semiconductor layer of jth light emitting cell and the second conductive type semiconductor layer of (j+1)th light emitting cell, wherein (2M−2)th connection wire may connect the first conductive type semiconductor layer of (2M−2)th light emitting cell and the second conductive type semiconductor layer of Mth light emitting cell, and wherein each of the Mth to (2M−2)th connection wires may include a plurality of second branch wires, the second branch wires connecting the corresponding second conductive type semiconductor layer and the corresponding first conductive type semiconductor layer and spaced apart from each other.

The number of the first branch wires included in the nth connection wire and the number of second branch wires included in the (n+M−1)th connection wire may be equal to each other or different from each other.

The light emitting device may further include (2M−1)th to (3M−4)th connection wires, each of the (2M−1)th to the (3M−4)th connection wires including at least one third branch wire electrically connecting rth (M+1 r≤2M−2) light emitting cell and the (r−M+1)th light emitting cell.

The at least one third branch wire may be configured to electrically connect the second conductive type semiconductor layer of the even-numbered (r−M+1)th light emitting cell to the first conductive type semiconductor layer of the odd-numbered rth light emitting cell. The at least one third branch wire may be configured to electrically connect the first conductive type semiconductor layer of the odd-numbered (r−M+1)th light emitting cell to the second conductive type semiconductor layer of the even-numbered rth light emitting cell.

Adjacent connection wires among the first to (3M−4)th connection wires may have the planar shape of zigzags.

The light emitting device may further include a first electrode pad connected to the second conductive type semiconductor layer of the first light emitting cell; and a second electrode pad connected to the first conductive type semiconductor layer of the Mth light emitting cell.

In another embodiment, a light emitting device package may include the light emitting device.

In still another embodiment, a light emitting apparatus may include the light emitting device package.

Advantageous Effects

Since, in the light emitting device according to the embodiment, the adjacent light emitting cells are connected to each other by a plurality of branch wires, even when some of the plurality of branch wires is broken, the current path is ensured by the remaining branch wires which are not broken, thereby minimizing or preventing non-operation thereof due to the brokenness of the connection wire.

DESCRIPTION OF DRAWINGS

FIG. 1 is a plan view of a conventional light emitting device.

FIG. 2 shows a plan view of a light emitting device according to an embodiment.

FIG. 3 shows a partial cross-sectional view taken along the illustrated line I-I' shown in FIG. 2

FIG. 4 is a circuit diagram of the light emitting device shown in FIG. 2.

FIG. 5 is a plan view of a light emitting device according to another embodiment.

FIG. 6 shows a circuit diagram of a light emitting device shown in FIG. 5.

FIG. 7 is a plan view of a light emitting device according to still another embodiment.

FIG. 8 shows a circuit diagram of a light emitting device shown in FIG. 7.

BEST MODE

Hereinafter, embodiments of this disclosure will be described in detail with reference to the accompanying drawings to help understanding this disclosure. However, the embodiments according to this disclosure may have different forms and should not be construed as being limited to the descriptions set forth herein. The embodiments of this disclosure are provided so that this disclosure is thorough and complete and fully conveys the concept of this disclosure to those of ordinary skill in the art.

In the description of embodiments, it should be understood that when an element is referred to as being "on or under" another element, the term "on or under" refers to either a direct connection between two elements or an indirect connection between two elements having one or more elements formed therebetween. In addition, when the term "on or under" is used, it may refer to a downward direction as well as an upward direction with respect to an element.

Further, the relational terms such as "first" and "second," "over/upper portion/above," and "below/lower portion/under" do not necessarily require or include any physical or logical relationship or sequence between devices or elements, and may also be used only to distinguish one device or element from another device or element.

Thicknesses of layers and areas in the drawings may be exaggerated, omitted, or schematically described for a convenient and precise description. In addition, the size of each component does not fully match the actual size thereof.

FIG. 2 shows a plan view of a light emitting device 100A according to an embodiment, and FIG. 3 shows a partial cross-sectional view taken along the illustrated line I-I' shown in FIG. 2

Referring to FIGS. 2 and 3, the light emitting device 100A according to an embodiment includes a substrate 110, first to Mth light emitting cells, first to the (M−1)th connection wires, first and second electrode pads (or bonding pads) 142 and 144, and an insulating layer 150. Here, M may be a positive integer of 2 or greater.

Hereinafter, for a convenient description, the number M of light emitting cells as illustrated in FIG. 2 is assumed to be 10, but the embodiments are not limited thereto. The following description may be applied even in case that the number M of light emitting cells is greater than 10 or less than 10.

The first to the Mth light emitting cells may be disposed to be spaced apart from each other on the substrate 110. In case of M=10 as shown in FIG. 2, the first to tenth light emitting cells may be disposed to be spaced from each other in the horizontal direction on the substrate 110.

The substrate 110 may be formed of a material suitable for growth of semiconductor materials, e.g., a carrier wafer. In addition, the substrate 110 may be formed of a material with excellent thermal conductivity and may be a conductive substrate or an insulating substrate. In addition, the substrate 110 may be formed of an optically transmissive material and may have sufficient mechanical strength not to cause bending of the total nitride light emitting structures 120 of the light emitting device 100 and to satisfactorily separate into chips through scribing and breaking. For example, the substrate 110 may include at least one material selected from among sapphire ($Al_2O_3$), GaN, SiC, ZnO, Si, GaP, InP, $Ga_2O_3$, GaAs, and Ge. The substrate 110 may be provided at an upper surface thereof with an uneven patterned portion. For example, although not shown, the substrate 110 may be a patterned sapphire substrate (PSS).

In addition, although not shown, a buffer layer may be further disposed between the substrate 110 and the light emitting structure 120. The buffer layer may be formed using a Group III-V compound semiconductor. The buffer layer plays the role of reducing a difference in lattice constant between the substrate 110 and the light emitting structure 120. For example, the buffer layer may include AlN or an undoped nitride, but embodiments are not limited thereto. The buffer layer may be omitted according to type of the substrate 110 and types of the light emitting structure 120.

First, a plurality of light emitting regions P1 to PM is referred to, in ascending order, as first to Mth light emitting regions. For convenience of explanation, a light emitting region in which the first electrode pad 142 is disposed is referred to as a first light emitting region P1, and a light emitting region in which the second electrode pad 144 is disposed is referred to as a Mth light emitting region.

First to Mth light emitting cells are respectively disposed in the first to Mth light emitting regions of the substrate 110. That is, the first light emitting cell is disposed in the first light emitting region P1 of the substrate 110, the second light emitting cell is disposed in the second light emitting region P2 of the substrate 110, the third light emitting cell is disposed in the third light emitting region P3 of the substrate 110, the fourth light emitting cell is disposed in the fourth light emitting region P4 of the substrate 110, the fifth light emitting cell is disposed in the fifth light emitting region P5 of the substrate 110, the sixth light emitting cell is disposed in the sixth light emitting region P6 of the substrate 110, the seventh light emitting cell is disposed in the seventh light emitting region P7 of the substrate 110, the eighth light emitting cell is disposed in the eighth light emitting region P8 of the substrate 110, the ninth light emitting cell is disposed in the ninth light emitting region P9 of the substrate 110 and the tenth light emitting cell is disposed in the tenth light emitting region P10 of the substrate 110. As such, a mth ($1 \leq m \leq M$) light emitting cell is disposed in a mth light emitting region Pm of the substrate 110. Hereinafter, the mth light emitting cell is represented as 'Pm' for convenience of explanation.

The mth light emitting cell corresponding to each of the first to Mth light emitting cells P1 to PM includes the light emitting structure 120, first and second contact layers (or, electrodes) 132 and 134, and a conductive layer 160 that are disposed on the substrate 110.

The light emitting structure 120 constituting one light emitting cell may be separated from the light emitting structure 120 of another light emitting cell by a boundary region S. The boundary region S may be a region located in a boundary of each of the first to Mth light emitting cells P1 to PM, e.g., the substrate 110. The first to Mth light emitting cells P1 to PM may have the same area, but embodiments are not limited thereto.

The light emitting structure 120 of each light emitting cell Pm may include a first conductive type semiconductor layer 122, an active layer 124, and a second conductive type semiconductor layer 126 that are sequentially disposed on the substrate 110. For example, as shown in FIG. 3, the fifth light emitting cell P5 (m=5) may include a first conductive type semiconductor layer 122, an active layer 124, and a second conductive type semiconductor layer 126 that are sequentially disposed on the substrate 110.

The first conductive type semiconductor layer 122 may be disposed between the substrate 110 and the active layer 124, include a semiconductor compound, for example, a Group III-V or II-VI compound semiconductor, and be doped with a first conductive type dopant. For example, the first conductive type semiconductor layer 122 may include at least one of a semiconductor material having the formula of $Al_xIn_yGa_{(1-x-y)}N$ ($0 \leq x \leq 1$, $0 \leq y \leq 1$, and $0 \leq x+y \leq 1$), InAlGaN, AlGaAs, GaP, GaAs, GaAsP, or AlGaInP. When the first conductive type semiconductor layer 122 is an n-type semiconductor layer, the first conductive type dopant may include an n-type dopant such as Si, Ge, Sn, Se, Te, or the like. The first conductive type semiconductor layer 122 may have a single layer structure or a multilayer structure, but embodiments are not limited thereto.

The active layer 124 may be disposed between the first conductive type semiconductor layer 122 and the second conductive type semiconductor layer 126 and may include any one of a single well structure, a multi-well structure, a single quantum well structure, a multi quantum well (MQW) structure, a quantum dot structure, and a quantum wire structure. The active layer 124 may include at least one pair structure of a well layer/a barrier layer, e.g., of InGaN/GaN, InGaN/InGaN, GaN/AlGaN, InAlGaN/GaN, GaAs(InGaAs)/AlGaAs, or GaP(InGaP)/AlGaP using a Group III-V compound semiconductor material, but embodiments are not limited thereto. The well layer may be formed of a material having a smaller energy band gap than that of the barrier layer.

The second conductive type semiconductor layer 126 may be disposed on the active layer 124 and may include a semiconductor compound. The second conductive type semiconductor layer 126 may be formed of a Group III-V semiconductor compound, a Group II-VI semiconductor compound, or the like. For example, the second conductive type semiconductor layer 126 may include at least one of a semiconductor material having the formula of $In_xAl_yGa_{1-x-y}N$ ($0 \leq x \leq 1$, $0 \leq y \leq 1$, and $0 \leq x+y \leq 1$), AlInN, AlGaAs, GaP, GaAs, GaAsP, or AlGaInP.

The second conductive type semiconductor layer 126 may be of a second conductive type. When the second conductive type semiconductor layer 126 is a p-type semiconductor layer, the second conductive type dopant may be a p-type dopant such as Mg, Zn, Ca, Sr, Ba, or the like. The second conductive type semiconductor layer 126 may have a single layer or multilayer structure, but embodiments are not limited thereto.

The first conductive type semiconductor layer 122 may be of an n-type and the second conductive type semiconductor layer 126 may be of a p-type. In another embodiment, the first conductive type semiconductor layer 122 may be of a p-type and the second conductive type semiconductor layer 126 may be of an n-type. Accordingly, the light emitting structure 120 may include at least one of an n-p junction structure, a p-n junction structure, an n-p-n junction structure, or a p-n-p junction structure.

Meanwhile, a side surface of the light emitting structure 120 may be inclined with respect to the substrate 110. As such, the side surface of the light emitting structure 120 is inclined to prevent brokenness of the connection wire electrically connecting the neighboring light emitting cells.

Also, in each light emitting cell Pm, the first contact layer 132 is disposed on the first conductive type semiconductor layer 122. For example, referring to FIG. 3, in the fifth light emitting cell P5, the first electrode 132 is disposed on the first conductive type semiconductor layer 122. To dispose the first contact layer 132 on the first conductive type semiconductor layer 122, the first conductive type semiconductor layer 122 of the light emitting structure 120 may be partially exposed. That is, the second conductive type semiconductor layer 126, the active layer 124, and the first conductive type semiconductor layer 122 may be partially etched by mesa etching to expose a portion of the first conductive type semiconductor layer 122. In this regard, an exposed surface of the first conductive type semiconductor layer 122 may be disposed lower than a lower surface of the active layer 124.

In another embodiment, instead of separately disposing the first contact layer 132 on the first conductive type semiconductor layer 122 in an nth light emitting cell Pn ($1 \leq n \leq M-1$), the first contact layer 132 may be integrally formed with an nth connection wire. For example, unlike FIG. 3, the first contact layer 132 of the fifth light emitting cell P5 is integrally formed with the first branch wire CE51, which is described later, of the fifth connection wire.

Then, the first contact layer 132 of the Mth light emitting cell (e.g., the tenth light emitting cell P10) may be integrally formed with the second electrode pad 144, but embodiments are not limited thereto. That is, the first contact layer 132 of the Mth light emitting cell PM may be separately formed from the second electrode pad 144.

In each light emitting cell Pm, the second contact layer 134 may be disposed on the second conductive type semiconductor layer 126 to be electrically connected to the second conductive type semiconductor layer 126. For example, referring to FIG. 3, in the sixth light emitting cell P6, the second contact layer 134 is disposed on the second conductive type semiconductor layer 124.

Alternatively, instead of separately disposing the second contact layer 134 on the second conductive type semiconductor layer 126 in each light emitting cell Pm, the second contact layer 134 of a ith light emitting cell Pi ($2 \leq i \leq M$) may be integrally formed with a first branch wire, which is described later, of the (i−1)th connection wire. For example, unlike FIG. 3, the second contact layer 134 of the sixth light emitting cell P6 may be integrally formed with the first branch wire CE51 of the fifth connection wire. Here, the second contact layer 134 of the first light emitting cell P1 may be integrally formed with the first electrode pad 142, but the embodiments are not limited thereto. In another embodiment, however, the second contact layer 134 of the first light emitting cell P1 may be separately formed from the first electrode pad 142.

Each of the first and second contact layers 132 and 134 of each light emitting cell Pm may have a structure in which an adhesive layer (not shown), a barrier layer (not shown), and a bonding layer (not shown) are sequentially stacked. The adhesive layer of the first contact layer 132 may include a material in ohmic contact with the first conductive type semiconductor layer 122, and the adhesive layer of the second contact layer 134 may include a material in ohmic contact with the second conductive type semiconductor layer 126. For example, the adhesive layer may be formed as a single layer or multiple layers using at least one of Cr, Rd, or Ti.

The barrier layer may be disposed on the adhesive layer and may be formed as a single layer or multiple layers using at least one of Ni, Cr, Ti, or Pt. For example, the barrier layer may be formed of a Cr—Pt alloy.

In addition, a reflection layer formed of Ag or the like may be disposed between the barrier layer and the adhesive layer, but may be omitted. The bonding layer is disposed on the barrier layer and may include Au.

Meanwhile, the first electrode pad 142 may be bonded with a wire (not shown) for supplying a first power. Referring to FIG. 2, the first electrode pad 142 may be disposed on the second conductive type semiconductor layer 126 of any one (e.g., the first light emitting cell P1) of the first to Mth light emitting cells P1 to PM and be electrically connected to the second conductive type semiconductor layer 126.

In addition, the second electrode pad 144 may be bonded with a wire (not shown) for supplying a second power. Referring to FIG. 2, the second electrode pad 144 may be disposed on the first conductive type semiconductor layer 122 of another (e.g., the tenth light emitting cell P10) of the first to Mth light emitting cells P1 to PM and be electrically connected to the first conductive type semiconductor layer 122.

In addition, the conductive layer 160 may be further disposed between the second contact layer 134 and the second conductive type semiconductor layer 126. The conductive layer 160 reduces total reflection and is highly optically transmissive and thus may increase extraction efficiency of light having been emitted from the active layer 124 and passed through the second conductive type semiconductor layer 126. The conductive layer 160 may be formed as a single layer or multiple layers using at least one of transparent oxide-based materials that have high transmittance with respect to luminescence wavelengths, e.g., indium tin oxide (ITO), tin oxide (TO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), aluminum tin oxide (ATO), gallium zinc oxide (GZO), $IrO_x$, $RuO_x$, $RuO_x$/ITO, Ni, Ag, Ni/$IrO_x$/Au, or Ni/$IrO_x$/Au/ITO. In an occasion, the conductive layer may be omitted. An area of the conductive layer 160 disposed on the second conductive type semiconductor layer 126 may be equal to or less than an area of an upper surface of the second conductive type semiconductor layer 126.

Meanwhile, the first to (M−1)th connection wires may electrically connect the first to Mth light emitting cells to each other in series. As shown in FIG. 2, in case of M=10, the first to ninth connection wires CE11 to CE95 may connect the first to tenth light emitting cells P1 to P10 in series. That is, the first to (M−1)th connection wires may connect the first to Mth light emitting cells P1 to PM in series, starting from the first light emitting cell P1 in which the first electrode pad 142 is disposed and ending at the Mth light emitting cell PM in which the second electrode pad 144 is disposed The nth connection wire corresponding to each of the first to (M−1)th connection wires may electrically connect the first conductive type semiconductor layer 122 of the nth light emitting cell to the second conductive type semiconductor layer 126 of the (n+1)th light emitting cell. That is, the nth connection wire is disposed on the nth light emitting region Pn, an (n+1)th light emitting region P(n+1), and a boundary region S therebetween to electrically connect the nth light emitting cell Pn and the (n+1)th light emitting cell P(n+1) that adjoin each other.

In addition, according to the embodiment, the nth connection wire may include a plurality of the first branch wires separated from each other.

For example, a first connection wire (n=1) may include three first branch wires CE11, CE12, and CE13 which electrically connect the first conductive type semiconductor layer 122 of the first light emitting cell P1 to the second conductive type semiconductor layer 126 of the second light emitting cell P2.

The second connection wire (n=2) may include four first branch wires CE21, CE22, CE23, and CE24 which electrically connect the first conductive type semiconductor layer 122 of the second light emitting cell P2 to the second conductive type semiconductor layer 126 of the third light emitting cell P3.

The third connection wire (n=3) may include five first branch wires CE31, CE32, CE33, CE34, and CE25 which electrically connect the first conductive type semiconductor layer 122 of the third light emitting cell P3 to the second conductive type semiconductor layer 126 of the fourth light emitting cell P4.

The fourth connection wire (n=4) may include two first branch wires CE41 and CE42 which electrically connect the first conductive type semiconductor layer 122 of the fourth light emitting cell P4 to the second conductive type semiconductor layer 126 of the fifth light emitting cell P5.

The fifth connection wire (n=5) may include three first branch wires CE51, CE52, and CE53 which electrically connect the first conductive type semiconductor layer 122 of the fifth light emitting cell P5 to the second conductive type semiconductor layer 126 of the sixth light emitting cell P6.

The sixth connection wire (n=6) may include four first branch wires CE61, CE62, CE63, and CE64 which electrically connect the first conductive type semiconductor layer 122 of the sixth light emitting cell P6 to the second conductive type semiconductor layer 126 of the seventh light emitting cell P7.

The seventh connection wire (n=7) may include five first branch wires CE71, CE72, CE73, CE74, and CE75 which electrically connect the first conductive type semiconductor layer 122 of the seventh light emitting cell P7 to the second conductive type semiconductor layer 126 of the eighth light emitting cell P8.

The eighth connection wire (n=8) may include four first branch wires CE81, CE82, CE83, and CE84 which electrically connect the first conductive type semiconductor layer 122 of the eighth light emitting cell P8 to the second conductive type semiconductor layer 126 of the ninth light emitting cell P9.

The ninth connection wire (n=9) may include five first branch wires CE91, CE92, CE93, CE94, and CE95 which electrically connect the first conductive type semiconductor layer 122 of the ninth light emitting cell P9 to the second conductive type semiconductor layer 126 of the tenth light emitting cell P10.

As described above, a portion of the numbers of the first branch wires included in the respective first to the Nth connection wires may be equal to each other, and another portion of the numbers of the first branch wires included in the respective first to the Nth connection wires may be different from each other. For example, as shown in FIG. 2, the number of the first branch wires CE41 and CE42 included in the fourth connection wire is two, the number of the first branch wires included in each of the first and fifth connection wires is three, the number of the first branch wires included in each of the second, sixth, and eighth connection wires is four, and the number of the first branch wires included in each of the third, seventh, and ninth connection wires is five.

Further, the numbers of the first branch wires included in the respective first to Nth connection wires are all equal to each other or may be all different from each other.

Each of the first branch wires CE11 to CE95 included in the respective first to the Nth connection wires as aforementioned may be made of material identical to or different from material of each of the first and second contact layers 132 and 134. If each of the first branch wires CE11 to CE95 is made of material identical to material of each of the first and second contact layers 132 and 134, the first branch wires CE11 to CE95 may be integrally formed with the first or second contact layer 132 or 134. Each of the first branch wires CE11 to CE95 may include at least one of Cr, Rd, Au, Ni, Ti, or Pt, but embodiments are not limited thereto.

In case that the first conductive type semiconductor layer 122 includes an n-type semiconductor layer and the second conductive type semiconductor layer 126 includes a p-type semiconductor layer, the closer the first branch wire is disposed to the second electrode pad 144, the higher the possibility that the first branch wire is broken may be because the mobility of the electron is greater than that of the hole. Accordingly, the number of the first branch wires may increase from the first connection wire close to the first electrode pad 142 to the Nth connection wire close to the second electrode pad 142.

In addition, the first to the Mth light emitting cells may be divided into a plurality of groups. For example, as illustrated in FIG. 2, the first to tenth the light emitting cells P1 to P10 may be divided into two groups. The first to fifth light emitting cells P1 to P5 may belong to the first group G1 and the sixth to tenth light emitting cells P6 to P10 may belong to the second group G2, but the first to Mth light emitting cells P1 to PM may be divided into more than two groups.

In addition, the numbers of light emitting cells included in the respective groups may be the same as five as illustrated in FIG. 2. Or, the numbers of light emitting cells included in the respective groups may be different from each other.

In this way, when the first to the Mth light emitting cells are divided into a plurality of groups, the total number of the first branch wires included in the connection wire belonging to the group adjacent to the Mth light emitting cell may be greater than the total number of the first branch wires included in the connection wire belonging to the group adjacent to the first light emitting cell P1. In FIG. 2, if it is assumed that the fifth connection wire CE52 does not belong to the first and second groups G1 and G2 because the fifth connection wire CE52 plays the role of connecting the first group G1 to the second group G2, the total number 18 of the first branch wires CE61 to CE95 included in the sixth to ninth connection wires belonging to the second group G2 may be greater than the total number 14 of the first branch wires CE11 to CE42 included in the first to fourth connection wires belonging to the first group G1.

In addition, although each of the first to the (M−1)th connection wires is shown as having a square planar shape in the light emission device 100A shown in FIG. 2, the embodiments are not limited thereto. That is, each of the first to the (M−1)th connection wires may have a variety of planar shapes FIG. 4 is a circuit diagram of the light emitting device 100A shown in FIG. 2.

Referring to FIGS. 2 and 4, the light emitting device 100A may have a common single positive (+) terminal, e.g., the first electrode pad 142, and a common single negative (−) terminal, e.g., the second electrode pad 144. The first electrode pad 142 may electrically be connected to the second conductive type semiconductor layer 126 of the first light emitting cell P1, and the second electrode pad 144 may electrically be connected to the first conductive type semiconductor layer 122 of the Mth light emitting cell (for example, the tenth light emitting cell P10 in case of FIG. 2). Each of the first and second electrode pads 142 and 144 may have a planar shape as shown in FIG. 2, but embodiments are not limited thereto. That is, each of the first and second electrode pads 142 and 144 may have various planar shapes.

FIG. 5 is a plan view of a light emitting device 100B according to another embodiment.

Unlike the light emitting device 100A shown in FIG. 2, the light emitting device 100B shown in FIG. 5 further includes (M+1)th through (2M−2)th light emitting cells and the Mth to (2M−2)th connection wires as well as the first to Mth light emitting cells and the first to the (M−1)th connection wires. Except for this difference, the light emitting device 100B shown in FIG. 5 is identical to the light emitting device 100A shown in FIG. 2 so that redundant explanation thereof is omitted.

The first to the Mth light emitting cells are disposed to be spaced apart from each other in the horizontal direction on the substrate 110. The (M+1)th to (2M−2)th light emitting cells may be disposed between the first light emitting cell and the Mth light emitting cell with being spaced apart from each other in the horizontal direction on the substrate 110.

For example, in case of M=10, as illustrated in FIG. 5, the first to tenth light emitting cells P11, P12, P13, P14, P15, P16, P17, P18, P19, and P20 are disposed with being spaced apart from each other in the horizontal direction on the substrate 110. At this time, the eleventh (M+1=11) to the eighteenth (2M−2=18) light emitting cells P21 to P28 are disposed between the first light emitting cells P11 and the tenth light emitting cells P20 with being spaced apart from each other in the horizontal direction on the substrate 110.

As shown in FIG. 3, each of the first to the Mth light emitting cells includes the first conductive type semiconductor layer 122, the active layer 124, and the second conductive type semiconductor layer 126 which are sequentially disposed on the substrate 110. Similarly, the kth light emitting cell corresponding to each of the (M+1)th to (2M−2)th light emitting cells includes the first conductive type semiconductor layer 122, the active layer 124, and the second conductive type semiconductor layer 126 which are sequentially disposed on the substrate 110. Here, the $M+1 \leq k \leq 2M-2$. The first conductive type semiconductor layer 122, the active layer 124, and the second conductive type semiconductor layer 126 are as described above.

The first through the Mth light emitting cells are connected in series by the first to the (M−1)th connection wires, and the first light emitting cell, the (M+1)th to (2M−2)th light emitting cells, and the Mth light emitting cell are connected in series by the Mth to the (2M−2)th connection wires. For example, in case of M=10, referring to FIG. 5, the first to ninth connection wires connect the first light emitting cell to the tenth light emitting cells P10 in series, and the tenth (M=10) to the eighteenth (2M−2=18) connection wires connect the first light emitting cell P1, the eleventh to eighteenth light emitting cells P21 to P18, and the tenth light emitting cell P20 in series.

The nth connection wire corresponding to each of the first to the (M−1)th connection wires may electrically connect the first conductive type semiconductor layer 122 of the nth light emitting cell and the second conductive type semiconductor layer 126 of the (n+1)th light emitting cell. To this end, according to the embodiment, the nth connection wire may include a plurality of first branch wires which are spaced apart from each other. For example, in case of M=10, the first connection wire (n=1) may include two first branch wires CE111 and CE112 for electrically connecting the first conductive type semiconductor layer 122 of the first light emitting cell P11 to the second conductive type semiconductor layer 126 of the second light emitting cell P12.

The second connection wire (n=2) may include two first branch wires CE121 and CE122 for electrically connecting the first conductive type semiconductor layer 122 of the second light emitting cell P12 to the second conductive type semiconductor layer 126 of the third light emitting cell P13.

The third connection wire (n=3) may include two first branch wires CE131 and CE132 for electrically connecting the first conductive type semiconductor layer 122 of the third light emitting cell P13 to the second conductive type semiconductor layer 126 of the fourth light emitting cell P14.

The fourth connection wire (n=4) may include two first branch wires CE141 and CE142 for electrically connecting the first conductive type semiconductor layer 122 of the fourth light emitting cell P14 to the second conductive type semiconductor layer 126 of the fifth light emitting cell P15.

The fifth connection wire (n=5) may include two first branch wires CE151 and CE152 for electrically connecting the first conductive type semiconductor layer 122 of the fifth light emitting cell P15 to the second conductive type semiconductor layer 126 of the sixth light emitting cell P16.

The sixth connection wire (n=6) may include two first branch wires CE161 and CE162 for electrically connecting the first conductive type semiconductor layer 122 of the sixth light emitting cell P16 to the second conductive type semiconductor layer 126 of the seventh light emitting cell P17.

The seventh connection wire (n=7) may include two first branch wires CE171 and CE172 for electrically connecting the first conductive type semiconductor layer 122 of the seventh light emitting cell P17 to the second conductive type semiconductor layer 126 of the eighth light emitting cell P18.

The eighth connection wire (n=8) may include two first branch wires CE181 and CE182 for electrically connecting the first conductive type semiconductor layer 122 of the eighth light emitting cell P18 to the second conductive type semiconductor layer 126 of the ninth light emitting cell P19.

The ninth connection wire (n=9) may include two first branch wires CE191 and CE192 for electrically connecting the first conductive type semiconductor layer 122 of the ninth light emitting cell P19 to the second conductive type semiconductor layer 126 of the tenth light emitting cell P20.

Further, each of the Mth to (2M−2)th connection wires may electrically connect the corresponding first conductive type semiconductor layer 122 and the corresponding second conductive type semiconductor layer 126, and include a plurality of second branch wires which are spaced apart from each other.

In detail, the Mth connection wire electrically connects the first conductive type semiconductor layer 122 of the first light emitting cell and the second conductive type semiconductor layer 126 of the $M+1^{st}$ light emitting cell. For example, referring to FIG. 5, in case of M=10, the tenth connection wire may include two second branch wires CE113 and CE114 for electrically connecting the first conductive type semiconductor layer 122 of the first light emitting cell P11 to the second conductive type semiconductor layer 126 of the eleventh light emitting cell P21.

In addition, the jth connection wire corresponding to each of the (M+1)th to (2M−3)th connection wires may electrically connect the first conductive type semiconductor layer 122 of the jth light emitting cell and the second conductive type semiconductor layer 126 of the (j+1)th light emitting cells. Here, the $M+1 \leq j \leq 2M-3$.

For example, in case of M=10, referring to FIG. 5, the eleventh connection wire may include two second branch wires CE211 and CE212 for electrically connecting the first conductive type semiconductor layer 122 of the eleventh light emitting cell P21 to the second conductive type semiconductor layer 126 of the twelfth light emitting cell P22.

The twelfth connection wire may include two second branch wires CE221 and CE222 for electrically connecting the first conductive type semiconductor layer 122 of the twelfth light emitting cell P22 to the second conductive type semiconductor layer 126 of the thirteenth light emitting cell P23.

The thirteenth connection wire may include two second branch wires CE231 and CE232 for electrically connecting the first conductive type semiconductor layer 122 of the thirteenth light emitting cell P23 to the second conductive type semiconductor layer 126 of the fourteenth light emitting cell P24.

The fourteenth connection wire may include two second branch wires CE241 and CE242 for electrically connecting the first conductive type semiconductor layer 122 of the fourteenth light emitting cell P24 to the second conductive type semiconductor layer 126 of the fifteenth light emitting cell P25.

The fifteenth connection wire may include two second branch wires CE251 and CE252 for electrically connecting the first conductive type semiconductor layer 122 of the fifteenth light emitting cell P25 to the second conductive type semiconductor layer 126 of the sixteenth light emitting cell P26.

The sixteenth connection wire may include two second branch wires CE261 and CE262 for electrically connecting the first conductive type semiconductor layer 122 of the sixteenth light emitting cell P26 to the second conductive type semiconductor layer 126 of the seventeenth light emitting cell P27.

The seventeenth connection wire may include two second branch wires CE271 and CE272 for electrically connecting the first conductive type semiconductor layer 122 of the seventeenth light emitting cell P27 to the second conductive type semiconductor layer 126 of the eighteenth light emitting cell P28.

The (2M−2)th connection wire may include a plurality of the second branch wires for electrically connecting the first conductive type semiconductor layer 122 of the (2M−2)th light emitting cell to the second conductive type semiconductor layer 126 of the Mth light emitting cell. For example, in case of M=10, referring to FIG. 5, The eighteenth connection wire may include two second branch wires CE281 and CE282 for electrically connecting the first conductive type semiconductor layer 122 of the eighteenth light emitting cell P28 to the second conductive type semiconductor layer 126 of the tenth light emitting cell P20.

In FIG. 5, each of the first to the (M−1)th connection wires includes two first branch wires, and each of the Mth to the (2M−2)th connection wires includes two second branch wires, but the embodiments are not limited thereto. That is, the number of the first branch wires included in each of the first to (M−1)th connection wires may be greater or less than two, and the number of the second branch wires included in each of the Mth to (2M−2)th connection wires may be greater or less than two.

In addition, the number of the first branch wires included in the nth (1≤n≤M−1) connection wire and the number of the second branch wires included in the (n+M−1)th connection wire may be equal to or different from each other.

For example, in case of M=10, referring to FIG. 5, the number of the first branch wires CE111 and CE112 included in the first connection wire (n=1) and the number of the second branch wires CE113 and CE114 included in the tenth connection wire are equal to each other.

Likewise, the number of the first branch wires CE121 and CE122 included in the second connection wire (n=2) and the number of the second branch wires CE211 and CE212 included in the eleventh connection wire are equal to each other.

In addition, the number of the first branch wires CE131 and CE132 included in the third connection wire (n=3) and the number of the second branch wires CE221 and CE222 included in the twelfth connection wire are equal to each other.

In addition, the number of the first branch wires CE141 and CE142 included in the fourth connection wire (n=4) and the number of the second branch wires CE231 and CE232 included in the thirteenth connection wire are equal to each other.

In addition, the number of the first branch wires CE151 and CE152 included in the fifth connection wire (n=5) and the number of the second branch wires CE241 and CE242 included in the fourteenth connection wire are equal to each other.

In addition, the number of the first branch wires CE161 and CE162 included in the sixth connection wire (n=6) and the number of the second branch wires CE251 and CE252 included in the fifteenth connection wire are equal to each other.

In addition, the number of the first branch wires CE171 and CE172 included in the seventh connection wire (n=7) and the number of the second branch wires CE261 and CE262 included in the sixteenth connection wire are equal to each other.

In addition, the number of the first branch wires CE181 and CE182 included in the eighth connection wire (n=8) and the number of the second branch wires CE271 and CE272 included in the seventeenth connection wire are equal to each other.

In addition, the number of the first branch wires CE191 and CE192 included in the ninth connection wire (n=9) and the number of the second branch wires CE281 and CE282 included in the eighteenth connection wire are equal to each other.

However, unlike FIG. 5, according to another embodiment, the number of the first branch wires included in the nth connection wire and the number of the second branch wires included in the (n+M−1)th connection wire may be different from each other.

FIG. 6 shows a circuit diagram of a light emitting device 100B shown in FIG. 5.

Referring to FIGS. 5 and 6, the light emitting device 100B may have a common single positive (+) terminal, e.g., the first electrode pad 142, and a common single negative (−) terminal, e.g., the second electrode pad 144. The first electrode pad 142 may electrically be connected to the second conductive type semiconductor layer 126 of the first light emitting cell P11, and the second electrode pad 144 may electrically be connected to the first conductive type semiconductor layer 122 of the Mth light emitting cell (for example, the tenth light emitting cell P20 in case of FIG. 5). Each of the first and second electrode pads 142 and 144 may have a planar shape as shown in FIG. 5, but embodiments are not limited thereto. That is, each of the first and second electrode pads 142 and 144 may have various planar shapes.

FIG. 7 is a plan view of a light emitting device 100C according to still another embodiment.

Unlike the light emitting device 100B shown in FIG. 5, the light emitting device 100C shown in FIG. 7 may further include (2M−1)th to (3M−4)th connection wires as well as the first to the (2M−2)th light emitting cells and the first to the (2M−2)th connection wires. Except for this difference, the light emitting device 100C shown in FIG. 7 is identical to the light emitting device 100B shown in FIG. 5 so that redundant explanation thereof is omitted.

Each of the (2M−1)th to the (3M−4)th connection wires may include at least one third branch wire for connecting electrically the rth (M+1 r 2M−2) light emitting cell and the (r−M+1)th light emitting cell. In case of M=10, each of the nineteenth to the twenty-sixth connection wires may include at least one third branch wire.

For example, referring to FIG. 7, in case of r=11, the nineteenth connection wire may include the third branch wire CE311 for electrically connecting the eleventh light emitting cell P21 and the second light emitting cell P12.

In case of r=12, the twentieth connection wire may include the third branch wire CE312 for electrically connecting the twelfth light emitting cell P22 and the third light emitting cell P13.

In case of r=13, the twenty first connection wire may include the third branch wire CE313 for electrically connecting the thirteenth light emitting cell P23 and the fourth light emitting cell P14.

In case of r=14, the twenty second connection wire may include the third branch wire CE314 for electrically connecting the fourteenth light emitting cell P24 and the fifth light emitting cell P15.

In case of r=15, the twenty third connection wire may include the third branch wire CE315 for electrically connecting the fifteenth light emitting cell P25 and the sixth light emitting cell P16.

In case of r=16, the twenty fourth connection wire may include the third branch wire CE316 for electrically connecting the sixteenth light emitting cell P26 and the seventh light emitting cell P17.

In case of r=17, the twenty fifth connection wire may include the third branch wire CE317 for electrically connecting the seventeenth light emitting cell P27 and the eighth light emitting cell P18.

In case of r=18, the twenty sixth connection wire may include the third branch wire CE318 for electrically connecting the eighteenth light emitting cell P28 and the ninth light emitting cell P19.

In addition, at least one third branch wire may electrically connect the second conductive type semiconductor layer 126 of the even-numbered (r−M+1)th light emitting cells, e.g., in case of M=10, each of the second, fourth, sixth, and eighth light emitting cells P12, P14, P16, and P18, to the first conductive type semiconductor layer 122 of each of the odd-numbered rth light emitting cells, e.g., the eleventh, thirteenth, fifteenth, and seventeenth light emitting cells P21, P23, P25, and P27.

In addition, at least one third branch wire may electrically connect the first conductive type semiconductor layer 122 of the odd-numbered (r−M+1)th light emitting cells, e.g., in case of M=10, each of the third, fifth, seventh, and ninth light emitting cells P13, P15, P17, and P19, to the second conductive type semiconductor layer 126 of each of the even-numbered rth light emitting cells, e.g., the twelfth, fourteenth, sixteenth, and eighteenth light emitting cells P22, P24, P26, and P28.

FIG. 8 shows a circuit diagram of a light emitting device 100C shown in FIG. 7.

Referring to FIGS. 7 and 8, the light emitting device 100C may have a common single positive (+) terminal, e.g., the first electrode pad 142, and a common single negative (−) terminal, e.g., the second electrode pad 144. The first electrode pad 142 may electrically be connected to the second conductive type semiconductor layer 126 of the first light emitting cell P11, and the second electrode pad 144 may electrically be connected to the first conductive type semiconductor layer 122 of the Mth light emitting cell (for example, the tenth light emitting cell P20 in case of FIG. 7). Each of the first and second electrode pads 142 and 144 may have a planar shape as shown in FIG. 7, but embodiments are not limited thereto. That is, each of the first and second electrode pads 142 and 144 may have various planar shapes.

Further, each of the third branch wires CE311 to CE318 is one as shown in FIG. 7, but embodiments are not limited thereto. That is, according to another embodiment, each of the third branch wires CE311 to CE318 may be more than one.

Further, in each of the light emitting devices 100A, 100B, and 100C as respectively shown in FIGS. 2, 5, and 7, the adjacent connection wires among the first to the (3M−4)th connection wires may have a planar shape of zigzags, but embodiments are not limited thereto. For example, the first branch wire CE111 and CE112 belonging to the first connection wire and the first branch wires CE121 and CE122 belonging to the second connection wire adjacent thereto may have the planar shape of zigzags. This is to prevent the adjacent first branch wires from be overlapped in case that the lengths of the respective light emitting regions are small, but the embodiments are not limited to the planar shape of each of the adjacent first, second, and third branch wires.

On the other hand, the insulating layer 150 is disposed between the first, second, and third branch wires and the adjacent light emitting cells connected by the branch wires, thereby electrically insulating the first, second, and third branch wires from the light emitting cells. That is, the insulating layer 150 is disposed between the first branch wire of the nth connection wire and the neighboring nth and the (n+1)th light emitting cells Pn and P(n+1) connected by the first branch wire, to electrically insulate the first branch wire of the nth connection wire from the nth light emitting cell Pn and to electrically insulate the first branch wire from the (n+1)th light emitting cell P(n+1). For example, referring to FIG. 3, the insulating layer 150 is disposed between the first branch wire CE51 of the fifth connection wire and the adjacent fifth and sixth light emitting cells P5 and P6, thereby electrically insulating the first branch wire CE51 of the fifth connection wire from each of the fifth and sixth light emitting cells P5 and P6. However, embodiments are not limited thereto. That is, according to another embodiment, the insulating layer 150 may be further disposed on the plurality of light emitting cells and the boundary region S. That is, the insulating layer 150 may cover the upper surface and the sides of the plurality of light emitting cells, and the boundary regions S. The insulating layer 150 may be formed of an optically transmissive and insulating material, e.g., $SiO_2$, $SiO_x$, $SiO_xN_y$, $Si_3N_4$, or $Al_2O_3$.

Unlike the conventional light emitting device 10 shown in FIG. 1, the first to (2M−2)th light emitting cells of the light emitting devices 100A, 100B, and 100C shown in FIGS. 2, 5, and 7 may be disposed in a straight line. In this case, the current flows in the light emitting device 10 shown in FIG. 1 with bending in the direction CP of arrow, while the current flows in light emitting devices 100A, 100B, and 100C shown in FIGS. 2, 5, and 7 in a straight direction without bending in the direction CP1, CP2, CP3, CP4, CP5, CP6, CP7 of the arrow.

For example, referring to FIG. 2, the first through the Mth light emitting cells P1 to PM are connected to each other in a first direction, and, when the second direction is perpendicular to the first direction, the length L2 in the first direction of the light emitting element 100A may be greater than the width W2 in the second direction. In addition, in case of M=9, the length L2 shown in FIG. 2 may be longer than the length L1 shown in FIG. 1, and the width W2 shown in FIG. 2 may be smaller than the width W1 shown in FIG. 1. Also, in the light emitting devices 100B and 100C shown in FIGS. 5 and 7, the length may be greater than the width.

In addition, the adjacent light emitting cells 40 are electrically connected to each other by a connection wire 30 in the light emitting device 10 shown in FIG. 1. Referring to FIG. 3, the depth h1 of the boundary region S in which the insulating layer 150 may be buried is for example 4 μm to 8 μm, while the thickness h2 of the first contact layer 132 may be 1 μm to 3 μm. In this case, the connection wire 30 to connect the first contact layer and a second contact layer of the adjacent light emitting cells in the conventional light emitting device 10 shown in FIG. 1 may be broken. Or, the connection wire 30 may be broken due to other causes other than the above reasons. Thus, when the connection wire 30 to electrically connecting the adjacent light emitting cells is broken, the current path is not formed so that the entire light emitting element 10 may not be turned on.

On the other hand, in the respective light emitting devices 100A, 100B, and 100C shown in FIGS. 2, 5, and 7 according to the embodiment, the adjacent light emitting cells are connected by a plurality of first, second, and third branch wires. Accordingly, even when any one among a plurality of first, second, and third branch wires is broken, a current path is formed through the remaining wires which are not broken so that the light emitting device may be turned on.

In particular, in the light emitting devices 100B and 100C shown in FIGS. 5 and 7, since the second to ninth light emitting cells P12 to P19 and the eleventh to eighteenth light emitting cells P21 to P28 are connected to each other in parallel, the drive current may be low, thereby improving the efficiency.

Further, in case that the second to ninth light emitting cells P12 to P19 and the eleventh to eighteenth light emitting cells P21 to P28 are connected in parallel as shown in FIGS. 5 and 7, when any one of the current paths CP4 and CP5 is disconnected in FIG. 5, the current may flow through other current path, and, when any one of the current paths CP6 and CP7 is disconnected in FIG. 7, the current may flow through other current path. In particular, when implemented as shown in FIG. 7, the current spreading of the light emitting device 100C may be improved, thereby improving luminous efficiency.

In addition, in the light emitting device 100C shown in FIG. 7, when the all second branch wires CE121 and CE122 are broken so that the current path from the second light emitting cell P12 to the third light emitting cell P13 is disconnected, the current may flow through the third branch wire CE311. Similarly, when the all second branch wires CE211 and CE212 are broken so that the current path from the eleventh light emitting cell P21 to the twelfth light emitting cell P22 is disconnected, the current may flow through the third branch wire CE311. Similarly, when the second branch wire is broken, the rest of the third branch wires CE312 to CE318 may play the role of ensuring the current paths. Thus, in the event of brokenness in the connection wire, the light emitting device 100C shown in FIG. 7 may secure a current path to be more stable than the light emitting devices 100A and 100B shown in FIGS. 2 and 5.

A plurality of light-emitting device packages, each of which includes light emitting devices according to embodiments, may be arrayed on a board. Optical members, such as a light guide plate, a prism sheet, and a diffusion sheet, etc. may be disposed in a path of light emitted from the light emitting device packages. The light emitting device packages, the board, and the optical members may function as a backlight unit.

In addition, light emitting device packages according to embodiments may be included in a light emitting apparatus, such as a display apparatus, an indication apparatus, or a lighting apparatus.

The display apparatus may include a bottom cover, a reflection plate disposed on the bottom cover, a light emitting module for emitting light, a light guide plate disposed in front of the reflection plate for guiding the light emitted by the light emitting module forward, an optical sheet including prism sheets disposed in front of the light guide plate, a display panel disposed in front of the optical sheet, an image signal output circuit connected to the display panel for providing an image signal to the display panel, and a color filter disposed in front of the display panel. The bottom cover, the reflection plate, the light emitting module, the light guide plate, and the optical sheet may constitute a backlight unit.

In addition, the lighting apparatus may include a light source module including a board and light emitting device packages according to embodiments, a heat sink for dissipating heat generated from the light source module, and a power supply unit for processing or converting an electrical signal received from the outside and providing the processed or converted signal to the light source module. For example, a lighting apparatus may include a lamp, a head lamp, or a streetlight.

The head lamp may include a light emitting module including light emitting device packages disposed on a board, a reflector for reflecting light emitted by the light emitting module in a predetermined direction, for example forward, a lens for refracting the light reflected by the reflector forward, and a shade for blocking or reflecting a portion of the light reflected by the reflector and directed to the lens to achieve a light distribution pattern desired by a designer.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

MODE FOR INVENTION

Various embodiments have been described in the best mode for carrying out the invention.

INDUSTRIAL APPLICABILITY

Light emitting device, light emitting device package including the device, and light emitting apparatus including the package according to embodiments may be used in a display apparatus, an indication apparatus, or a lighting apparatus such as a lamp, a head lamp, or a streetlight.

The invention claimed is:
1. A light emitting device, comprising:
a substrate;
first to Mth (where, M is a positive integer of two or more) light emitting cells disposed to be spaced apart from each other on the substrate; and
first to Nth (where N is M−1) connection wires configured to electrically connect the first to the Mth light emitting cells in series,
wherein an mth (where, 1≤m≤M) light emitting cell comprises a first conductive type semiconductor layer, an active layer, and a second conductive type semiconductor layer sequentially disposed on the substrate,
wherein an nth (where, $1 \leq n \leq N$) connection wire connects an nth light emitting cell to an (n+1)th light emitting cell, the nth connection wire including a plurality of first branch wires spaced apart from each other,
wherein the nth light emitting cell is adjacent to the (n+1)th light emitting cell, and
wherein each of the first branch wires connects the first conductive type semiconductor layer of the nth light emitting cell to the second conductive type semiconductor layer of the (n+1)th light emitting cell.

2. The light emitting device according to claim 1, wherein the numbers of the first branch wires included in the first to the Nth connection wires are equal to each other.

3. The light emitting device according to claim 1, wherein the numbers of the first branch wires included in the first to the Nth connection wires are different from each other.

4. The light emitting device according to claim 3, wherein the first conductive type semiconductor layer includes an n-type semiconductor layer, and the second conductive semiconductor layer includes a p-type semiconductor layer.

5. The light emitting device according to claim 4, wherein the number of the first branch wires increases as the first branch wires approaches from the first connection wire to the Nth connection wire.

6. The light emitting device according to claim 1, wherein the first to the Mth light emitting cells are divided into a plurality of groups, and
wherein a total number of the first branch wires included in a connection wire belonging to a group adjacent to the Mth light emitting cell is greater than a total number of the first branch wires included in a connection wire belonging to a group adjacent to the first light emitting cell.

7. The light emitting device according to claim 6, wherein the numbers of the light emitting cells included in a plurality of groups are different from each other.

8. The light emitting device according to claim 6, wherein the numbers of the light emitting cells included in a plurality of groups are equal to each other.

9. The light emitting device according to claim 1, wherein the first to the Mth light emitting cells are disposed in a straight line.

10. The light emitting device according to claim 9, wherein the first to the Mth light emitting cells are connected to each other in a first direction,
wherein the second direction is perpendicular to the first direction, and
wherein, a length of the light emitting device in the first direction is greater than a width of the light emitting device in the second direction.

11. The light emitting device according to claim 1, further comprising:
(M+1)th to (2M−2)th light emitting cells disposed between the first light emitting cell and the Mth light emitting cell to be spaced apart from each other on the substrate; and
Mth to (2M−2)th connection wires connecting the first, the M+1$^{st}$ to (2M−2)th, and the Mth light emitting cells in series,
wherein kth (where, $M+1 \leq k \leq 2M-2$) light emitting cell comprises a first conductive type semiconductor layer, an active layer, and a second conductive type semiconductor layer sequentially disposed on the substrate,
wherein Mth connection wire connects the first conductive type semiconductor layer of the first light emitting cell and the second conductive type semiconductor layer of (M+1)th light emitting cell,
wherein jth (where, $M+1 \leq j \leq 2M-3$) connection wire connects the first conductive type semiconductor layer of jth light emitting cell and the second conductive type semiconductor layer of (j+1)th light emitting cell,
wherein (2M−2)th connection wire connects the first conductive type semiconductor layer of (2M−2)th light emitting cell and the second conductive type semiconductor layer of Mth light emitting cell, and
wherein each of the Mth to (2M−2)th connection wires includes a plurality of second branch wires, the second branch wires connecting the corresponding second conductive type semiconductor layer and the corresponding first conductive type semiconductor layer and spaced apart from each other.

12. The light emitting device according to claim 11, wherein the number of the first branch wires included in the nth connection wire and the number of second branch wires included in the (n+M−1)th connection wire are equal to each other.

13. The light emitting device according to claim 11, wherein the number of the first branch wires included in the nth connection wire and the number of second branch wires included in the (n+M−1)th connection wire are different from each other.

14. The light emitting device according to claim 11, further comprising (2M−1)th to (3M−4)th connection wires, each of the (2M−1)th to the (3M−4)th connection wires including at least one third branch wire electrically connecting rth ($M+1 \leq r \leq 2M-2$) light emitting cell and the (r−M+1)th light emitting cell.

15. The light emitting device according to claim 14, wherein the at least one third branch wire is configured to electrically connect the second conductive type semiconductor layer of the even-numbered (r−M+1)th light emitting cell to the first conductive type semiconductor layer of the odd-numbered rth light emitting cell.

16. The light emitting device according to claim 14, wherein the at least one third branch wire is configured to electrically connect the first conductive type semiconductor layer of the odd-numbered (r−M+1)th light emitting cell to the second conductive type semiconductor layer of the even-numbered rth light emitting cell.

17. The light emitting device according to claim 14, wherein adjacent connection wires among the first to (3M−4)th connection wires has the planar shape of zigzags.

18. The light emitting device according to claim 1, further comprising:
a first electrode pad connected to the second conductive type semiconductor layer of the first light emitting cell; and
a second electrode pad connected to the first conductive type semiconductor layer of the Mth light emitting cell.

19. A light emitting device package, comprising the light emitting device according to claim 1.

20. A light emitting apparatus, comprising the light emitting device package according to claim 19.

* * * * *